United States Patent [19]

Terashi et al.

[11] Patent Number: 5,756,408
[45] Date of Patent: May 26, 1998

[54] GLASS-CERAMIC SINTERED BODY

[75] Inventors: Yoshitake Terashi; Hideto Yonekura; Satoru Hamano, all of Kokubu, Japan

[73] Assignee: Kyocera Corporation, Kyoto, Japan

[21] Appl. No.: 743,970

[22] Filed: Oct. 30, 1996

[30] Foreign Application Priority Data

Oct. 30, 1995 [JP] Japan .................. 7-282083

[51] Int. Cl.$^6$ .................................. C03C 10/06
[52] U.S. Cl. .................. 501/8; 501/10; 501/32; 428/434
[58] Field of Search .................. 501/8, 10, 32; 428/434

[56] References Cited

U.S. PATENT DOCUMENTS

| | | | |
|---|---|---|---|
| 4,621,066 | 11/1986 | Nishigaki et al. | 501/8 |
| 5,045,402 | 9/1991 | Adams, Jr. et al. | 501/8 |
| 5,338,710 | 8/1994 | Ishigame et al. | 501/32 |
| 5,369,067 | 11/1994 | Ismail et al. | 501/8 |

*Primary Examiner*—Karl Group
*Attorney, Agent, or Firm*—Loeb & Loeb LLP

[57] ABSTRACT

A glass-ceramic sintered body containing Si, Al, Zn, element of Group 2a and Group 4a of the periodic table, and Boron and Oxygen, as constituent elements, and comprising a glass phase and crystalline phases, wherein the crystalline phase comprises a first crystalline phase of a composite oxide containing at least Si, Al and Ca or Sr, or, Si, Al, Ca and Sr, a second crystalline phase of $ZrO_2$ crystalline and a third crystalline phase of spinel crystalline is presented. The glass-ceramic sintered body has a high dielectric constant of not smaller than 8.5 and have a fracture strength of not smaller than 20 kg/mm$^2$ and preferred as an insulation substrate of a circuit board, a substrate board for mounting an integrated circuit or an electronic compornent part.

4 Claims, 4 Drawing Sheets

○ (Ca, Sr) - Al - Si - O
∴ SPINEL
× $ZrO_2$
■ $TiO_2$
△ $Al_2O_3$
● $BAlO_3$

FIG. 4

GLASS-CERAMIC SINTERED BODY

BACKGROUND OF THE INVENTION

1 (Field of the Invention)

This invention relates to a glass-ceramic sintered body, and more specifically to a glass-ceramic sintered body most preferred as an insulation substrate of a circuit board, a substrate board for mounting an integrated circuit or an electronic component part. In particular, it relates to a glass-ceramic sintered body which can be sintered at as low as 800° to 1000° C. for a multilayer wiring substrate provided with a wiring of copper, silver and gold.

2 (Description of the Prior Art)

In recent years, with an era of a high degree of information, transmission of information tends to become higher in speed and frequency. In movable wirelesses such as automobile telephones or personal wirelesses, and new media such as satellite broadcasting, satellite communication and CATV, compacting of the machinery has been expedited, and with this movement, it has been strongly desired to construct circuit elements for microwaves such as resonators for dielectrics as small-sized products.

The size of circuit element for microwaves depends on the wavelength of of an electromagnetic wave used.

The wavelength λ of the electromagnetic wave propagating in a dielectric having a specific inductive capacity εr becomes $\lambda = \lambda o/(\epsilon r)^{1/2}$ when the propagating wavelength in vacuum is λo. Accordingly, the circuit element can be made small-sized as the dielectric constant of the substrate material used is as large as possible.

In a step of connecting various electronic component parts and input and output terminals to a multilayer circuit board, the substrate board will be broken or broken pieces may be formed. To prevent breaking, the materials may require a high mechanical strength.

Materials for circuit boards which satisfy high dielectric constants and high strengths, for example, as disclosed in Japanese Laid-Open Patent Publication No. 132621/1994, there have been proposed circuit substrates by dispersing inorganic dielectric particles into resins, or reinforcing a circuit board with high dielectric constant glass fibers. Since these circuit boards have a high dielectric constant, the machinery can be made small-sized. Furthermore, since this substrate is reinforced with high dielectric constant glass fibers, it has a high strength.

Furthermore, a glass ceramic substrate is frequently used as a cheap circuit board, and is vigorously developed. Furthermore, since this glass ceramic can be produced by mixing glass with a filler component such as $Al_2O_3$, cristobalite and forsterite and firing the mixture at a temperature of 900° to 1100° C. As a wiring layer, a metalizing layer of gold, silver or copper can be multilayered and sintering with the metalizing layer can be simultaneously carried out.

However, the circuit substrate shown in Japanese Laid-Open Patent Publication No. 132621/1994 has a sintering temperature of about 400° C. Thus, multilayer-formation cannot be performed by using a wiring conductor such as copper and subtle wiring cannot be carried out.

Conventional glass-ceramics can be multilayered with metallized layers of gold, silver or copper and simultaneously sintered. But the resulting multilayer and simultaneously sintered layer are unsuitable for small-sizing because such layers have a low dielectric constant of 7 or less. Furthermore, these layers have a strength of at most about 20 kg/mm². Breaking or broken pieces tend to be formed at the time of connecting electronic component parts or input and output terminals.

SUMMARY OF THE INVENTION

It is an object of this invention to provide a ceramic composition that can be sintered at 800° to 1000° C. and elaborated and has high strength and can be multilayered using a wiring conductor of gold, silver or copper, the composition having a dielectric constant of at least 8.5.

According to this invention, there is provided a glass-ceramic sintered body containing, as constituent elements, Si, Al, Zn, elements of Group 2a of the periodic table, elements of Group 4a of the periodic table, boron and oxygen, the sintered body being composed of crystalline phases and a glass phase, wherein the crystalline phases comprise a first crystalline phase containing a composite oxide comprising at least Si, Al, Ca or Sr or a composite oxide comprising Si, Al, Ca and Sr, a second crystalline phase composed of a $ZrO_2$ crystalline phase and a third crystalline phase composed of a spinel crystalline phase.

According to the preseent invention, as one embodiment of the glass-ceramic sintered body, there is provided a glass-ceramic sintered body wherein the first crystalline phase is anorthite and/or slawsonite.

Furthermore, there is further provided a glass-ceramic sintered body wherein the crystalline phases further contain at least one crystalline phase selected from a $TiO_2$ crystal, a $Al_2O_3$ crystal, a perovskite crystal and a composite oxide crystal containing Al and B as a fourth crystallline phase.

Furthermore, there is further provided a glass-ceramic sintered body which is used as an insulation substrate for a wiring substrate, and on the surface of the glass-ceramic sintered body, a wiring layer comprising at least one of copper, silver and gold is formed.

BRIEF DESCRIPTION OF THE DRAWINGS

| Symbol | |
|---|---|
| 1 | $ZrO_2$ crystalline phase |
| 2 | spinel-type crystalline phase |
| 3 | anorthite-type crystalline phase |
| 5 | glass phase |

Symbol 4 . . . perovskite-type crystal

Other symbols are the same as in FIG. 1.

| Symbol | 1 | (Ca, Sr)—Al—Si—O type composite oxide crystalline phase |
|---|---|---|
| | 2 | spinel-type crystalline phase |
| | 3 | $ZrO_2$ crystalline phase |
| | 4 | $TiO_2$ (rutile type) crystalline phase |
| | 5 | $Al_2O_3$ crystalline phase |
| | 6 | B—Al-containing oxide crystalline phase |
| | 7 | glass phase |

PREFEERED EMBODIMENTS OF THE INVENTION

The glass-ceramic sintered body of this invention contains Si, Al, Group 2a elements of the periodic table, Group 4a elements of the periodic table, Zn, boron and oxygen as constituent elements and being composed of a glass phase and crystalline phases, wherein the crystalline phases comprises: (i) a first crystalline phase consisting of at least Si, Al and Group 2 elements of the periodic table, (ii) a second crystalline phase consisting of a $ZrO_2$ crystalline phase, and (iii) a third crystalline phase consisting of a spinel-type crystal.

The glass-ceramic sintered body of this invention has excellent dielectric properties and mechanical strength characteristics with a dielectric constant of at least 8.5 and a fracture strength of at least 20 kg/mm$^2$.

In the glass-ceramic sintered body of this invention, the first crystalline phase of a composite oxide containing at least Si, Al and metal elements of Group 2a of the periodic table among the three crystalline phases is preferably anorthite and/or slawsonite. This crystalline phase, together with the third crystalline phase of spinel, contributes to the improvement of dielectric characteristics of the sintered body of this invention.

The second crystalline phase of a $ZrO_2$ crystalline phase itself has a high dielectric constant, and the presence of the second crystalline phase increases the dielectric constant of the sintered body.

In the sintered body, the second crystalline phase also acts as a filler component, and contributes to the uniform dispersion of other crystalline phases such as the first crystalline phase and the third crystalline phase.

The spinel-type crystalline phase as the third crystalline phases contribute to the improvement of the strength characteristics of the sintered body, especially to the increase of its fracture strength.

The glass phase of the sintered body of this invention contributes to the low temperature elaborateness of the sintered body at the time of firing.

As a preferred embodiment of the sintered body of this invention, there may be cited a sintered body composed of a glass phase and crystalline phases in which the crystalline phases are composed of an anorthite crystalline phase (first crystalline phase), a $ZrO_2$ crystalline phase (second phase) and a spinel-type crystalline phase (third crystalline phase).

In this preferred embodiment, most preferred is a glass-ceramic sintered body which is obtained by mixing 30 to 70% by weight of a glass containing at least $SiO_2$, $Al_2O_3$, MgO, ZnO and $B_2O_3$ with 70 to 30% by weight of Ca oxide and Zr oxide or their compound as a filler, molding the mixture and sintering the molded product at a temperature of 800° to 950° C.

In this glass-ceramic sintered body of the present invention according to this preferred embodiment, if the amount of the glass mentioned above is smaller than 30% by weight or if the total amount of Zr and Ca calculated as an oxide is larger than 70% by weight, it is impossible to eleborate the ceramic fully at a temperature of 800° to 950° C. If the amount of the glass is larger than 70% by weight or if the total amount of Zr and Ca caculated as an oxide is smaller than 30% by weight, the dielectric constant of the sintered body tends to become lower.

Desirably, the amount of Zr calculated as $ZrO_2$ is 15–69% by weight based on the total amount and the amount of Ca calculated as CaO is 1 to 33% based on the total amount. If the amount of Zr is lower than 15% by weight, the ceramic has a lower dielectric constant. If the amount of Zr is larger than 69% by weight, the elaboration temperature becomes higher than 100° C. and a copper conductor cannot be used. If the amount of Ca is smaller than 1% by weight, the elaboration temperature of the ceramic becomes higher than 950° C., the shrinkage of the ceramic greatly deviates from the shrinkage curve of copper, and the copper conductor peels off. If the amount of Ca is greater than 33% by weight, the dielectric constant of the ceramic becomes lower than 8.5.

In this sintered body of this embodiment of the present invention, the amounts of Zr and Ca, in relation to the dielectric constant and the fracture strength, should desirably be such that the amount of Zr calculated as $ZrO_2$ is 30 to 60% by weight, and the amount of Ca calculated as CaO is 0.01 to 30% by weight.

Figure 1:
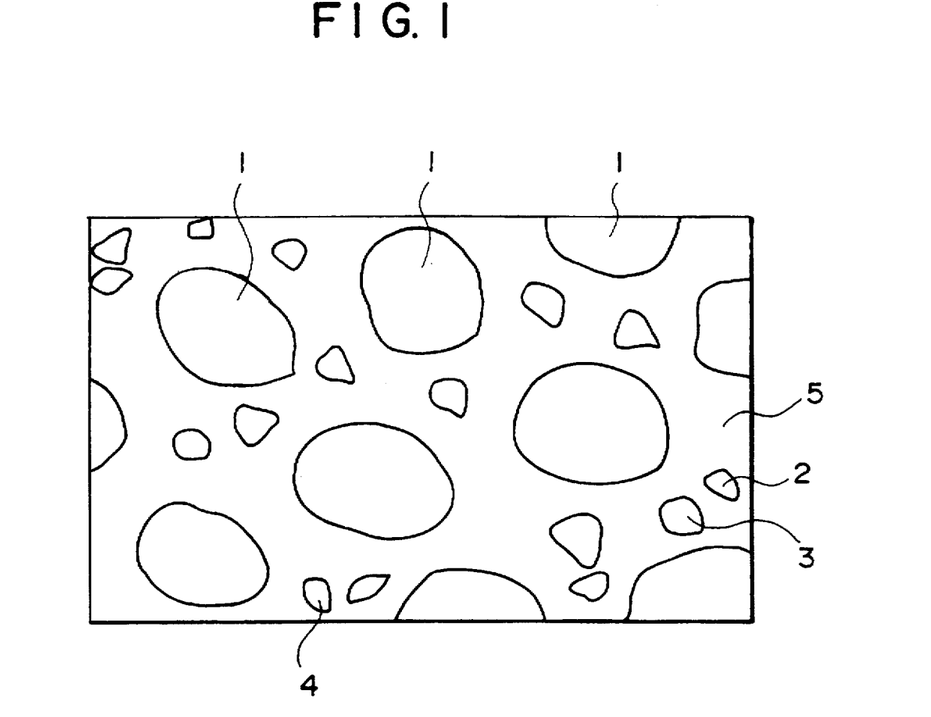
FIG. 1 is a schematic view showing the texture of the glass-ceramic sintered body of this invention composed of a first crystallline phase of an anorthite-type crystal, a second crystalline phase of a $ZrO_2$ crystal and a third crystalline phase of a spinel-type crystal.

FIG. 1 shows a schematic view of the texture of the glass-ceramic sintered body in accordance with this embodiment of the present invention. As shown in FIG. 1, the glass-ceramic sintered body of the present invention is composed of a $ZrO_2$ crystalline phase 1, a spinel-type crystalline phase 2 and an anorthite-type crystalline phase 3 and a glass phase 5 of $SiO_2$—$Al_2O_3$—SrO—CaO—MgO—ZnO—$B_2O_3$. The $ZrO_2$ crystalline phase 1 constitutes main crystals in the sintered body and exists a tetragonal crystal of $ZrO_2$. Furthermore, the spinel-type crystalline phase consists of a crystal of $MgO.Al_2O_3$ or a crystal of $ZnO.Al_2O_3$. Furthermore, the anorthite-type crystalline phase is a crystal of $CaAl_2Si_2O_8$. According to this invention, by causing zirconia (tetragonal crystal) to be present mainly in the sintered body, it is possible to increase the dielectric constant. Furthermore, by adjusting the sintering temperature, a spinel-type crystalline phase is precipitated in the sintered body. Since these crystalline phases are present in a form to reinforce the network of the glass, it is possible to obtain a sintered body having high mechanical strength.

However, when the crystallization of glass proceeds excessively in degree and the spinel-type crystalline phase increases too much, the dielectric constant may be lowered. Thus, by adjusting the sintering temperature to 800° to 950° C., a sintered body having high mechanical strength and a dielectric constant of at least 8.5 can be obtained.

To produce the grass-ceramic sintered body of this invention, 30 to 70% by weight of a glass of $SiO_2$—$Al_2O_3$—MgO—ZnO—$B_2O_3$ type as starting materials is mixed with 70 to 30% by weight calculated as an oxide of a Ca oxide and a Zr oxide or their compounds as filler components.

As filler components, a powder of $ZrO_2$, a carbonate, a sulfate or an acetate which can form $ZrO_2$ or CaO in the sintering step, and $CaZrO_3$ as a compound of $ZrO_2$ and CaO may be used. As a prescription composition, it is important that Zr should be compounded in an amount of 15 to 69 parts by weight calculated as $ZrO_2$ and Ca should be compounded in an amount of 1 to 33% by weight calculated as CaO. It is important that the Ca compound should precipitate an anorthite-type crystalline phase by reaction with glass. From this viewpoint, it is desirable that a Ca compound or a $CaZrO_3$ should be a fine powder having a size of 1.5 μm or below, especially 1.0 μm or below.

$ZrO_2$ as a filler component should desirably be compounded by adding a stabilizer such as $Y_2O_3$ in the form of a tetragonal crystal of $ZrO_2$ or a cubic crystal of $ZrO_2$. In the case of monoclinic zirconia, the phase will give rise to phase-transformation depending upon temperature, and the resulting volume variation causes cracks in the substrate.

A glass of $SiO_2$—$Al_2O_3$—MgO—ZnO—$B_2O_3$ type is used as a starting material because the use of this type of glass as a starting material causes the precipitation of a spinel-type crystalline phase and this crystalline phase is present for reinforcing the network of glass and it is possible to obtain a sintered body having high strength. Furthermore, the glass of this type is added in an amount of 30 to 70% by weight for the following reason. If the amount of glass is less than 30% by weight, the elaboration temperature of the sintered body is higher than 1000° C. and it is impossible to use a copper conductor. If the amount of the glass is larger than 70% by weight, the fracture strength of the ceramic is lowered.

The amount of a glass of the $SiO_2$—$Al_2O_3$—MgO—ZnO—$B_2O_3$ type is desirably 40 to 60% by weight, more particularly 40 to 50% by weight. A more specific composition of a glass of the $SiO_2$—$Al_2O_3$—MgO—ZnO—$B_2O_3$ type is desirably 40 to 45% by weight of $SiO_2$, 25 to 30% by weight of $Al_2O_3$, 8 to 12% by weight of MgO, 6 to 9% by weight of ZnO and 8 to 11% by weight of $B_2O_3$.

A binder is suitably added to the mixed powder by mixing the materials in a suitable composition described above, molding the mixture in a predetermined shape, and sintering the molded mixture at a non-oxidizable atmosphere such as $N_2$ or Ar for 0.1 to 5 hours at a temperature of 800° to 950° C. If the sintering temperature is lower than 800° C., the ceramic does not fully become elaborate. If the sintering temperature exceeds 950° C., it is impossible to use a copper conductor. Furthermore, the anorthite-type crystal contributing to a high dielectric constant is decomposed partly to form zircon ($ZrSiO_4$) or cordierite and produce a ceramic of inferior properties.

When a wiring substrate is produced by using such a glass ceramic, the mixed powder prescribed as stated above is subjected to a known tape molding method such as a doctor blade method or a rolling method to prepare a green sheet for forming an insulation layer. Thereafter, a metallic paste containing a powder of Ag, Au or Cu, especially a Cu powder, is used as a wiring metalized layer on the surface of the green sheet, the surface of the sheet is screen-printed using a wiring pattern, and at times, through holes are formed in the sheet and the paste is filled into the holes. Afterward, a plurality of sheets are laminated and pressed and sintered under the conditions described above to simultaneously sinter the wiring layers and the insulation layers.

According to this embodiment of the glass-ceramic sintered body of this invention, Zr oxide and Ca oxide are included as filler components to precipitate a $ZrO_2$ crystalline phase having a high dielectric constant, precipitate an anorthite-type crystalline phase by the reaction of a part of the glass with Ca, reduce the amount of glass having a low dielectric constant, and to increase the dielectric constant of the sintered body as a whole. By compounding Ca oxide as a filler component together with a glass of the $SiO_2$—$Al_2O_3$—MgO—ZnO—$B_2O_3$ type, the fracture strength of the sintered body can be increased by precipitating a spinel-type crystalline phase from the glass component.

Furthermore, this glass-ceramic sintered body can be sintered at a temperature of 800° to 950° C. simultaneously with an internal wiring layer of Au, Ag or Cu. Accordingly, fine wiring of a multilayer wiring substrate or a semiconductor element-containing package provided with these wiring conductors can be easily achieved.

As another embodiment of the sintered body of this invention, the fourth crystalline phase desirably contains at least one member selected from the group consisting of a $TiO_2$ crystalline phase, an $Al_2O_3$ crystalline phase, a perovskite crystalline phase and an oxide crystalline phase containing Al and B. Consequently, this fourth crystalline phase decreases the amount of the glass phase in the sintered body and increases the ratio of the crystalline phases, and accordingly this results in improving the characteristics of the sintered body such as strength.

According to another preferred embodiment of the sintered body of this invention, there is provided a sintered body of an embodiment in which the aforesaid crystalline phases include a first crystalline phase comprising a composite oxide crystalline phase composed of at least one type of Ca and Sr and Al and Si, a second crystalline phase comprising a $ZrO_2$ crystalline phase, a third crystalline phase comprising a spinel-type crystalline phase and a fourth phase comprising a perovskite-type crystalline phase. The perovskite cyrstalline phase in the sintered body of this embodiment contributes to the improvement of the characteristics of the sintered body such as strength, dielectric constant and TCC.

In this embodiment, a glass-ceramic sintered body obtained by mixing 30 to 70% by weight of a glass containing at least $SiO_2$, $Al_2O_3$, MgO, ZnO and $B_2O_3$, 15 to 69% by weight of fillers which are Ca oxide, Zr oxide or a compound thereof calculated as an oxide and 1 to 41% by weight of Sr oxide, Ti oxide or $SrTiO_3$, molding the mixture and sintering the molded mixture at a temperature of 800° to 1000° C. is preferred.

In the glass-ceramic sintered body of this embodiment in accordance with this invention, if the amounts of the glass mentioned above are less than 30% by weight, or the amount of Zr and Ca calculated as an oxide plus the amount of $SrTiO_3$ is larger than 70% by weight, the ceramic cannot be fully elaborated at a temperature of 800° to 1000° C. If the amount of the glass is larger than 70% by weight, or if the amount of Zr and Ca plus the amount of $SrTiO_3$ is less than 30% by weight, the dielectric constant of the sintered body is lower than 9.5 and furthermore, the absolute value of TCC becomes large. The desirable amount of the glass is 40 to 60% by weight.

The total amount of Ca and Zr calculated as an oxide is 15 to 69% by weight, especially 20 to 50% by weight. Desirably, the amount of Zr calculated as $ZrO_2$ is 10 to 60% by weight based on the entire amount, and the amount of Ca calculated as CaO is 1 to 40% by weight based on the entire amount. If the total amount of Ca and Zr is smaller than 15% by weight, or if the amount of Zr is less than 10% by weight, the dielectric constant of the ceramic is lower. If the total amount of Ca and Zr is larger than 69% by weight or if the amount of Zr is larger than 60% by weight, the elaboration temperature of the ceramic becomes higher than 1000° C. and it becomes impossible to use a copper conductor. If the amount of Ca is less than 1% by weight, the elaboration temperature of the ceramic becomes higher than 1000° C. and the shrinkage curve of the ceramic deviates from the shrinkage curve of copper with the consequence that the copper conductor peels off. If the amount of Ca is larger than 40% by weight, the dielectric constant of the ceramic becomes lower.

According to this invention, the amounts of Zr and Ca, in relation to the dielectric constant and the fracture strength, are desirably such that the amount of Zr calculated as $ZrO_2$ is 15 to 45% by weight, and the amount of Ca calculated as CaO is 1 to 20% by weight.

If the total amount of Sr and Ti calculated as an oxide is less than 1% by weight, TCC exceeds +200 ppm/°C. If the total amount of Sr and Ti exceeds 40% by weight, TCC becomes smaller than −200 ppm/°C. Desirably, the total amount of Sr and Ti is 10 to 25% by weight.

Figure 2:
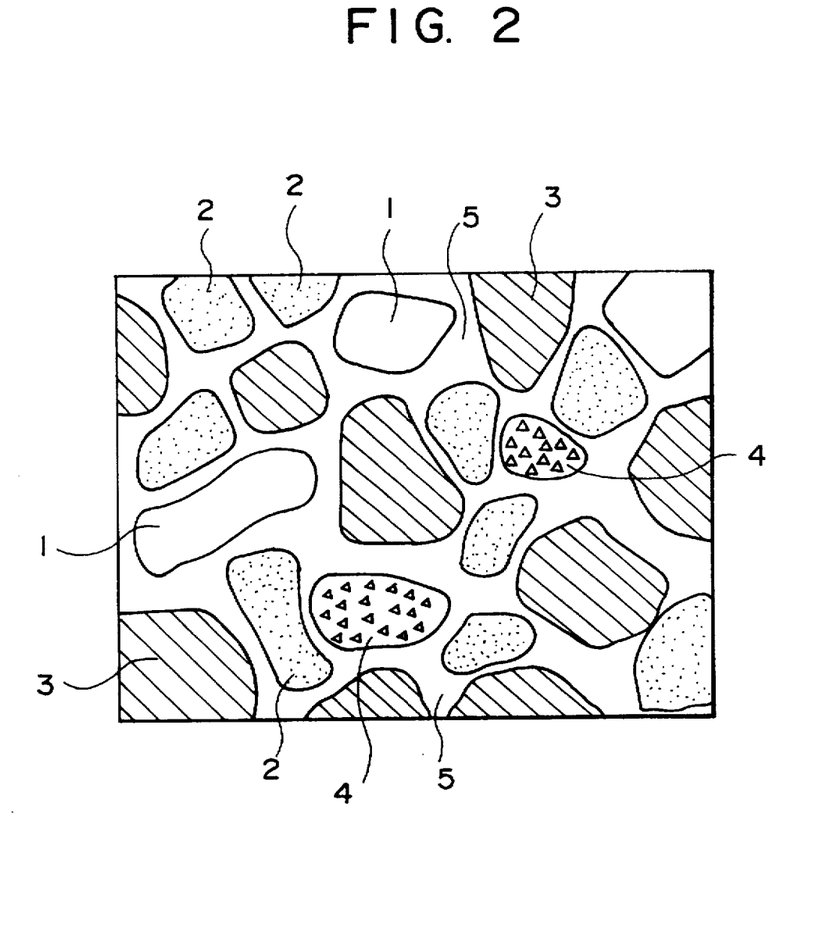
FIG. 2 is a schematic view showing the texture of the glass-ceramic sintered body of this invention composed of a first crystalline phase of a (Ca, Sr)—Al—Si—O type composite oxide crystal, a second crystalline phase of a $ZrO_2$-type crystal, and a third crystalline phase of a spinel-type crystal and a perovskite-type crystal.

FIG. 2 shows a rough view of the texture of a glass-ceramic sintered body of the embodiment of this invention. As shown in FIG. 2, the glass-ceramic sintered body of this invention is composed of a $ZrO_2$ crystalline phase 1, a spinel-type crystalline phase 2, a (Ca, Sr)—Al—Si—O type composite oxide crystalline phase 3, a perovskite-type crystalline phase 4 and a glass phase 5 composed of $SiO_2$—$Al_2O_3$—SrO—CaO—MgO—ZnO—$B_2O_3$. The $ZrO_2$ crystalline phase 1 exists as a second crystal phase in the sintered body. The spinel-type crystalline phase (third crystalline phase) is composed of a crystal of $MgO.Al_2O_3$ or a crystal of $ZnO.Al_2O_3$. Furthermore, the (Ca, Sr)—Al—Si—O type composite oxide crystalline phase (first crystalline phase) is an anorthite-type crystalline phase of $CaAl_2Si_2O_8$ or a slawsonite-type crystalline phase of $SrAl_2Si_2O_8$. Furthermore, the perovskite-type crystalline phase (fourth crystalline phase) is a crystal of $CaTiO_3$ or a crystal of (Ca, Sr)$TiO_3$. Sometimes, other phases such as a zircon ($ZrSiO_4$) phase or a cordierite phase may be precipitated, but these other phases must be as small as possible.

By causing a zirconia phase to exist in this sintered body, and simultaneously causing a perovskite-type phase to exist in the sintered body, the dielectric constant of the sintered body may be further increased. By further adjusting the sintering temperature, a spinel-type crystalline phase may be precipitated in the sintered body. Since this crystalline phase is present in the form of reinforcing the network of the glass, it is possible to obtain a sintered body having a high mechanical strength.

However, when the crystallization of glass proceeds excessively to increase the spinel-type crystalline phase, the dielectric constant is further lowered. By adjusting the sintering temperature to 800° to 1000° C., it is possible to obtain a sintered body having high mechanical strength and a dielectric constant of 9 to 10.

In order to produce the glass-ceramic sintered body of this embodiment in accordance with this invention, as starting materials, 30 to 70% by weight, especially 40 to 60% by weight, of a glass of $SiO_2,Al_2O_3$—MgO—ZnO—$B_2O_3$ type, 15 to 69% by weight, especially 20 to 50% by weight, of Ca oxide or Zr oxide or its compound such as $CaZrO_3$ as filler components, and 1 to 41% by weight, especially 10 to 25% by weight, of Sr oxide, Ti oxide or a compound such as $SrTiO_3$ are mixed. As the filler components, a powder of $ZrO_2$ or $TiO_2$ or a carbonate, and a sulfate or an acetate capable of forming $ZrO_2$, $TiO_2$, SrO or CaO in the sintering step may be added. In the prescribing composition, it is preferred to compound Zr calculated as $ZrO_2$ in an amount of 15 to 45% by weight, and it is also preferred to compound Ca calculated as CaO in an amount of 1 to 20% by weight. It is important that a Ca compound should precipitate an anorthite-type crystalline phase by reaction with the glass. From this viewpoint, a Ca compound or a $CaZrO_3$ powder should be a fine powder having a particle size of 1.5 μm or below, or 1.0 μm or below.

$ZrO_2$ as a filler component is added in the form of a tetragonal crystal of $ZrO_2$ or a cubic crystal by adding a stabilizer such as $Y_2O_3$. In the case of monoclinic zirconia, the phase is modified depending upon temperature and the resulting volume variation may cause the formation of cracks on the substrate.

Furthermore, the perovskite-type crystalline phase is dispersed in the sintered body by adding an oxide of Sr or Ti whereby a higher dielectric constant can be obtained. Further, the TCC may be lowered. From this viewpoint, the powder is desirably a fine powder having a particle size of 1.5 μm or below, especially 1.0 μm or below.

By using a glass of $SiO_2$—$Al_2O_3$—MgO—ZnO—$B_2O_3$ type, namely a zinc borosilicate glass containing $Al_2O_3$ and MgO, a spinel-type crystalline phase is precipitated. This glass phase exists in a form of reinforcing the network of the glass, and a sintered body having high strength can be obtained. The glass of this type is added in an amount of 30 to 70% by weight because if the amount of glass is less than 30% by weight, the elaboration temperature becomes higher than 1000° C. and it is impossible to use a copper conductor, and if the amount of glass is larger than 70% by weight, the fracture strength of the ceramic is reduced.

The amount of the glass of the $SiO_2$—$Al_2O_3$—MgO—ZnO—$B_2O_3$ type is preferably 40 to 60% by weight, especially 40 to 55% by weight. A preferred composition of the glass of the $SiO_2$—$Al_2O_3$—MgO—ZnO—$B_2O_3$ type consists of 40 to 45% by weight of $SiO_2$, 25 to 30% by weight of $Al_2O_3$, 8 to 12% by weight of MgO, 6 to 9% by weight of ZnO and 8 to 11% by weight of $B_2O_3$.

A binder is suitably added to the mixed powder prepared in the above-mentioned proportions, the mixture was molded in a predetermined shape, and sintered for 0.1 to 5 hours at a temperature of 800° to 1000° C. in a non-oxidizable atmosphere of $N_2$ or Ar. If the sintering temperature is lower than 800° C., the ceramic is not fully elaborated. If the temperature exceeds 1000° C., the copper conductor cannot be used. Furthermore, the anorthite-type crystal is decomposed to form zircon ($ZrSiO_4$) or cordierite having a low dielectric constant and the characteristics are aggravated.

When a wiring substrate is prepared by using this glass-ceramic, the above-prepared mixed powder prescribed as above is subjected to a known tape molding method such as a doctor blade method or a rolling method to prepare a green sheet for making an insulation layer. A metallic paste containing a power of Ag, Au or Cu, especially a powder of Cu, is used as a metalized layer for preparing a wiring layer on the surface of the sheet, screen-printed on the surface of the sheet through a wiring pattern, and at times, through holes are formed on the sheet and the above paste is filled into the through holes. Thereafter, a plurality of green sheets were laminated and pressed and then sintered under the conditions described above to be able to sinter both the wiring layer and the insulation layer simultaneously.

According to the glass-ceramic sintered body of this embodiment in accordance with this invention, a $ZrO_2$ crystalline phase having a high dielectric constant is precipitated by including Zr oxide and Ca oxide as filller components. Furthermore, high dielectric constants can be obtained by dispersing a perovskite-type crystalline phase such as $CaTiO_3$ or $SrTiO_3$ having a high dielectric constant in the sintered body. Furthermore, this perovskite-type crystalline phase has an effect of lowering TCC.

As a result of rection of a part of the glass components with Ca or Sr, the anorthite-type crystalline phase and/or the slawsonite-type crystalline phase are precipitated. This can reduce the amount of glass having a low dielectric constant, and accordingly, the dielectric constant and strength of the sintered body on the whole can be increased.

Furthermore, the fracture strength of the sintered body can be increased by precipitating the spinel-type crystalline phase from the glass of the $SiO_2$—$Al_2O_3$—MgO—ZnO—$B_2O_3$ type.

Moreover, since this glass-ceramic sintered body can be sintered at a temperature of 800° to 1000° C. simultaneously with an internal wiring layer of Au, Ag or Cu, fine wiring of multilayer wiring substrates or semiconductor element-accommodating packages provided with these wiring conductors can be easily achieved.

As another embodiment of the sintered body of this invention, there is provided a sintered body in which the crystalline phases comprises a first crystalline phase (a composite oxide crystalline phase containing at least one of Ca and Sr and Al and Si), a second crystalline phase (a $ZrO_2$ crystalline phase), a third phase of a spinel crystalline phase, and a fourth crystalline phase selected from a $TiO_2$[rutile type] crystalline phase, a $Al_2O_3$ crystalline phase, and an oxide crystalline phase containing B and Al.

A preferred sintered body among the sintered bodies of this embodiment includes a glass-ceramic sintered body obtained by mixing 30 to 70% by weight of a glass containing at least $SiO_2$, $Al_2O_3$, MgO, ZnO and $B_2O_3$, 5 to 30% by weight of Ca oxide, and Zr oxide and these compounds calculated as an oxide as filler components, and 0.1 to 20% by weight of $Al_2O_3$, or $Al_2O_3$ and $SiO_2$, or their compounds calculated as an oxide to form a mixture, molding the mixture, and sintering the molded mixture at a temperature of 800° to 1000° C.

The glass-ceramic sintered body of this embodiment according to this invention can be sintered at a temperature of 800° to 1000° C. with the softening and fluidization of the glass whereby gold, silver or copper can be sintered simultaneously with a metalized layer of wiring to provide a wiring layer as a multiple layer.

As a result of using a glass of the $SiO_2$—$Al_2O_3$—MgO—ZnO—$B_2O_3$ type, a spinel-type crystalline phase is precipitated from the glass, and this crystalline phase exists in the form of reinforcing the network of the glass so that a cermic having high strength can be obtained.

By including $ZrO_2$ and CaO as filler components, a $ZrO_2$ crystalline phase having a high dielectric constant is precipitated, and furthermore, a high dielectric constant can be obtained by dispersing a $TiO_2$ (rutile-type) crystalline phase having a high dielectric constant. Furthermore, the absolute value of the temperature coefficient capacitance (TCC) of the resonance frequency can be decreased by precipitating a $TiO_2$ (rutile-type) crystalline phase.

When the above ceramic composition is sintered at a temperature of 800° to 1000° C., it is possible to precipitate a composite oxide crystalline phase containing at least Ca or Sr and composed of Al and Si, a $ZrO_2$ crystalline phase, a spinel crystalline phase, a $TiO_2$ (rutile-type) crystalline phase, an $Al_2O_3$ crystalline phase and an oxide crystalline phase containing B and Al.

Among them, by precipitating the composite oxide crystallline phase composed of at least one of Ca or Sr and containing Al and Si [to be referred to as (Ca, Sr)—Al—Si—O type composite oxide crystalline phase], the $ZrO_2$ phase, and the $TiO_2$ (rutile-type) crystalline phase, the dielectric constant of the ceramic can be increased.

Furthermore, by precipitating the (Ca, Sr)—Al—Si—O type composite oxide crystalline phase and $ZnO.Al_2O_3$ or $MgO.Al_2O_3$ as the spinel-type crystalline phase, the ceramic can be strengthened. Furthermore, by compounding Ca oxide or Sr oxide as filler components together with a glass of the $SiO_2$—$Al_2O_3$—MgO—ZnO—$B_2O_3$ type, this reaction with the glass components causes precipitation of the (Ca, Sr)—Al—Si—O type composite oxide crystalline phase or the spinel-type crystalline layer and accordingly, the flexural strength of the sintered body can be increased. Furthermore, $B_2O_3$ in the glass components can be crystallized to form an oxide crystalline phase containing B and Al so that the acid resistance of the ceramic can be markedly increased.

When the ceramic composition in accordance with this embodiment of the present invention is sintered at as low as 800° to 1000° C., almost all the glass component in the composition is crystallized to reduce the glass component having a low dielectric constant whereby together with the filler component, various crystalline phases are precipitated to achieve a complex action including an action of increasing the dielectric constant, an action of lowering TCC and an action of increasing the strength. In addition, excellent characteristics which have no problem in resistance and dielectric loss tangent are maintained.

Furthermore, since this low-temperature sinterable ceramic composition can be sintered at a temperature of 800° to 1000° C. simultaneously with an internal wiring layer of silver, gold or copper, it is easy to achieve fine wiring of a multilayer wiring substrate or a semiconductor element-accommodating package provided with a wiring conductor.

This ceramic composition contains 45 to 80% by weight, especially 50 to 70% by weight, of a glass of at least $SiO_2$, $Al_2O_3$, MgO, ZnO and $B_2O_3$. If the amount of the glass is less than 45% by weight or if the total amount of the fillers other than the glass is larger than 55% by weight, the ceramic cannot be fully elaborated at a temperature of 800° to 1000° C. If the amount of the glass exceeds 80% by weight, or if the total amount of the fillers is smaller than 20% by weight, the dielectric constant of the composition is lower, and the absolute value of TCC becomes large.

The total amount of the fillers is 5 to 30% by weight, especially 10 to 25%, calculated as an oxide (CaO, $ZrO_2$ or $CaZrO_3$). In particular, in relation to the relation between the dielectric constant and the fracture strength, the amount of Zr calculated as $ZrO_2$ is desirably 4 to 29% by weight based on the entire amount, and the amount of Ca calculated as CaO is desirably 1 to 15% by weight based on the entire amount. If the amount of Ca or Zr is smaller than 5% by weight, or the amount of Zr is less than 4% by weight, an absolute value of TCC of the ceramic becomes large. If the amount of Ca and Zr is larger than 30% by weight, or if the amount of Zr is larger than 29% by weight, the elaboration temperature of the ceramic becomes higher than 1000° C. and a wiring with gold, silver or copper cannot be formed. If the amount of Ca is smaller than 1% by weight, the elaboration temperature of the ceramic becomes higher than 1000° C. Accordingly, the shrinkage curve of copper is greatly deviated from the shrinkage curve of the ceramic so that the copper conductor is peeled off. If the amount of Ca is larger than 15% by weight, the dielectric constant of the ceramic becomes lower.

Sr and Ti are contained in a total amount of 5 to 30% by weight, especially 10 to 20% by weight, calculated as an oxide (SrO, TiO$_2$). If this amount is lower than 5% by weight, TCC exceeds +200 ppm/°C. When the amount is larger than 30% by weight, the TCC becomes smaller than −200 ppm/°C.

An oxide of Al (Al$_2$O$_3$), or a total amount of the oxide of Al and SiO$_2$ are contained in a total amount of 0.1 to 20% by weight, especially 1 to 10% by weight. Especially, Si calculated as SiO$_2$ is desirably contained in an amount of 0 to 15% by weight based on the entire amount. If the amount of Al or Al and Si calculated as an oxide is less than 0.1% by weight, or the amount of Al$_2$O$_3$ is less than 0.1% by weights the ceramic has poor chemical resistance. If the total amount of Si and Al is larger than 20% by weight, or if the amount of Al$_2$O$_3$ is larger than 20% by weight, the elaboration temperature of the ceramic becomes higher than 1000° C., and the shrinkage curve of the ceramic is greatly deviated from the shrinkage curve of gold, silver or copper so that the conductor has a problem of peeling off.

Figure 3:
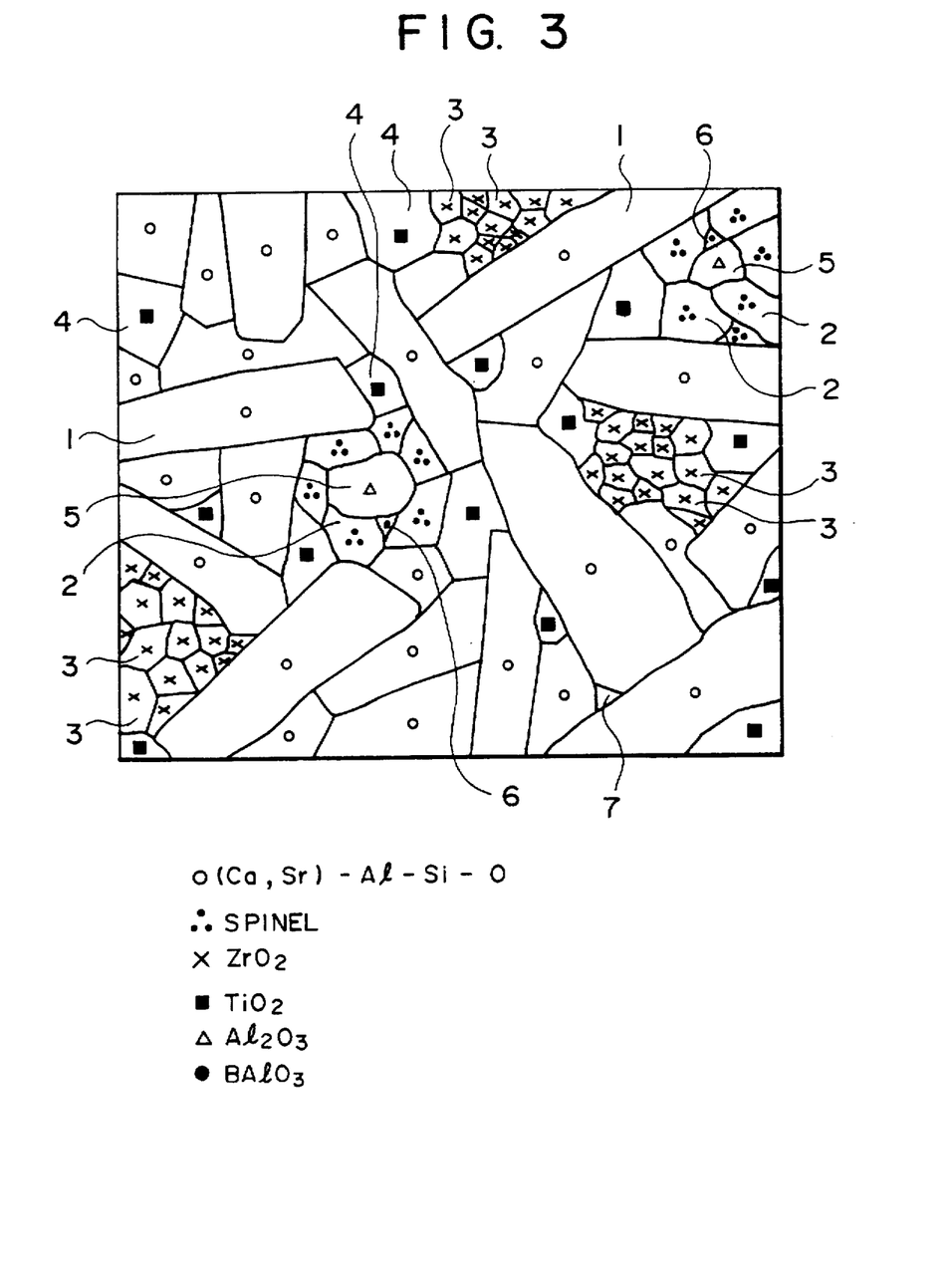
FIG. 3 is a schematic view showing the texture of the glass-ceramic sintered body of this invention composed of a first crystalline phase of a (Ca, Sr)—Al—Si—O type composite oxide, a second crystalline phase of a $ZrO_2$-type crystal, a third crystalline phase of a spinel-type crystal, and a fourth crystalline phase of a $TiO_2$(rutile)-type crystal, a $Al_2O_3$-type crystal and a B—Al-containing oxide crystal.

The above ceramic composition can be sintered at a temperature of 800° to 1000° C. in a non-oxidizable atmosphere such as N$_2$ or Ar. FIG. 3 shows a rough view of the texture of a ceramic obtained by sintering. As shown in FIG. 3, the ceramic of this invention is composed of a (Ca, Sr)—Al—Si—O type composite oxide crystalline phase 1, a spinel-type crystalline phase 2, a ZrO$_2$ crystalline phase 3, a TiO$_2$ (rutile-type) crystalline phase 4, a Al$_2$O$_3$ crystalline phase 5 and an oxide crystalline phase 6 containing B and Al. The (Ca, Sr)—Al—Si—O type composite oxide crystalline phase 1 exists as a main crystalline phase in the ceramic. Furthermore, the spinel-type cystalline phase is a crystal of ZnO.Al$_2$O$_3$ or MgO.Al$_2$O$_3$. Furthermore, the (Ca, Sr)—Al—Si—O type composite oxide crystal phase 1 includes a crystal of CaAl$_2$Si$_2$O$_8$ or (Ca, Sr)Al$_2$Si$_2$O$_8$. Furthermore, the TiO$_2$ phase is a rutile-type crystal. Sometimes, a glass phase 7 composed of SiO$_2$—Al$_2$O$_3$—CaO—SrO—MgO—B$_2$O$_3$—ZnO may exist at a triple point of the crystalline particles in this sintered body. In accordance with this invention, however, this glass phase should desirably be small.

The dielectric constant of the sintered body can be increased by causing the ZrO$_2$ crystalline phase 3 and the TiO$_2$ (rutile-type) crystalline phase 4 to exist simultaneously in the sintered body. Furthermore, by precipitating the (Ca, Sr)—Al—Si—O type composite oxide crystalline phase 1 and the spinel-type crystalline phase 2 in the sintered body, the sintering temperature can be adjusted, and since these crystalline phases exist in the form of reinforcing the network of the individual crystalline phases, a sintered body having a high mechanical strength can be obtained.

However, sintering at a high temperature decomposes the (Ca,Sr)—Al—Si—O type composite oxide crystalline phase to form an aggregate product of ZnSiO$_4$ having a low dielectric constant whereby the dielectric constant will be lowered and the mechanical strength will be reduced. Accordingly, by adjusting the sintering temperature to as low as 800° to 1000° C., it is possible to obtain a sintered body having high mechanical strength and a dielectric constant of 8.5 to 10.

A specific method of producing a ceramic composition that can be sintered at a low temperature in accordance with this invention first comprises mixing a glass of SiO$_2$—Al$_2$O$_3$—MgO—ZnO—B$_2$O$_3$ type as starting materials and CaO, ZrO$_2$ or CaZrO$_3$l SrO, TiO$_2$ or SrTiO$_3$, or Al$_2$O$_3$, or Al$_2$O$_3$ and SiO$_2$ as filler components to satisfy the above composition.

A more preferred composition of the glass of SiO$_2$—Al$_2$O$_3$—MgO—ZnO—B$_2$O$_3$ type desirably comprises 40 to 45% by weight of SiO$_2$, 25 to 30% by weight of Al$_2$O$_3$, 8 to 12% by weight of MgO, 6 to 9% by weight of ZnO and 8 to 11% by weight of B$_2$O$_3$.

As the filler components, there can be added in the form of a carbonate, a sulfate, or an acetate capable of forming an oxide in the sintering step in addition to powders of metal oxides. In the prescribing compositions, it is preferred to compound Zr calculated as ZrO$_2$ in an amount of 4 to 29% by weight based on the entire amount, and compound Ca calculated as CaO in an amount of 1 to 15% by weight based on the entire amount. Since it is important that the CaO component should be precipitated as a (Ca, Sr)—Al—Si—O type composite oxide crystalline phase by reaction with the above glass, a Ca compound or a CaZrO$_3$ powder should desirably be a fine powder having a particle size of 1.5 μm or below, especially 1.0 μm or below, in order to increase the reactability.

When SrTiO$_3$ is used, it should desirably be a fine powder having a particle size of 1.5 μm or below, especially 1.0 μm or below, in order to increase dispersibility and obtain a high dielectric constant.

A binder is suitably added to the mixed powder obtained by mixing the materials in such proportions, and the mixed powder is molded into a predetermined shape. The molded mixture is sintered for 0.1 to 5 hours at a temperature of 800° to 1000° C. in a non-oxidizable atmosphere such as N$_2$ or Ar to elaborate the sintered body to a relative density of at least 98%. If the sintering temperature is lower than 800° C., the ceramic is not fully elaborated, and when the sintering temperature exceeds 1000° C., a conductor of gold, silver or copper cannot be used. Furthermore, the (Ca, Sr)—Al—Si—O type composite-oxide crystalline phase or the ZrO$_2$ phase which contributes to the increase of the high dielectric constant is decomposed, whereby zirconia having a low dielectric constant is formed and accordingly the dielectric constant is aggravated, and the fracture strength is lowered as a result of aggregation of zirconia.

When a wiring substrate is prepared by using a ceramic composition for sintering a multilayer substrate at a low temperature, the mixed powder prescribed according to the above procedure is subjected to a known tape molding method such as a doctor blade method or a rolling method to form green sheets for forming an insulation layer, thereafter a metallic paste containing a powder of gold, silver or copper, especially a powder of copper, is coated on the surface of the sheet as a metalized layer of wiring in a wiring pattern by a screen printing, gravure printing or off-set printing, and as desired, the above paste is filled in the through holes on the sheets to form the paste in the through holes. Thereafter, a plurality of green sheets are laminated and pressed and then sintered under the above-mentioned conditions whereby a wiring layer and an insulation layer can be simultaneously sintered.

Hereinafter, the present invention will be specifically described by the following Examples.

(EXAMPLE 1)

A crystal glass of SiO$_2$—Al$_2$O$_3$—MgO—ZnO—B$_2$O$_3$ type (44% by weight of SiO$_2$, 29% by weight of Al$_2$O$_3$, 11% by weight of MgO, 7% by weight of ZnO and 9% by weight of B$_2$O$_3$) and ZrO$_2$ and CaCO$_3$ having a particle size of 1 μm or below in accordance with the composition shown in Table 1 were mixed. In Table 1, in samples Nos. 1-1, 1-2, 1-5, 1-9, 1-12, 1-14, a CaZrO$_3$ powder having an average particle diameter of 0.7 μm was added.

An organic binder, a plasticizer and toluene were added to the mixture, and green sheets having a thickness of 300 μm were prepared by a doctor blade method. Five such green sheets were laminated and heat-pressed at a temperature of 50° C. under a pressure of 100 Kg/cm². The resulting sheet assembly was treated to remove the binder at 700° C. in a steam-containing nitrogen atmosphere, and sintered in dry nitrogen under the conditions shown in Table 1 to obtain a glass-ceramic sintered body.

With the resulting sintered bodies, the dielectric constant and the fracture strength were evaluated by the following methods. The dielectric constant was measured in the following manner. A sample of a required shape having a diameter of 50 mm and a thickness of 1 mm was cut out, and the dielectric constant of each sample was measured by a cavity resonator method using a network analyzer and a synthesized sweeper. In the measurement, a dielectric substrate of the sample was sandwiched between cylindrical cavity resonators filled with sapphire and measured. The dielectric constant was calculated from the resonance characteristic of the resonator in accordance with a TE011 mode. The fracture strength was measured by taking a sample having a shape with a length of 70 mm, a thickness of 3 mm and a width of 4 mm and subjecting the sample to a three point bending test in accordance with JIS-C-2141. The results of measurement are shown in Table 1.

As a comparative example, as filler components, sintered bodies were prepared by using $Al_2O_3$ or forsterite in place of $ZrO_2$ or CaO and evaluated (samples 1-15 and 1-16). Furthermore, in place of the above crystal glass, a crystal glass B having a composition consisting of 55.2% by weight of $SiO_2$, 12% by weight of $Al_2O_3$, 4.4% by weight of $B_2O_3$, 20% by weight of MgO, 6.7% by weight of ZnO, 1.6% by weight of $Na_2O$ and 0.1% by weight of $ZrO_2$, and a crystal glass C having a composition consisting of 60.7% by weight of $SiO_2$, 9.3% by weight of $Al_2O_3$, 5% by weight of $B_2O_3$, 15.4% by weight of MgO, 8.6% by weight of ZnO and 1% by weight of $K_2O$ and $CaZrO_3$ having an average particle size of 0.7 μm as a filler were used and the resulting sintered bodies were evaluated in the same way as above (samples Nos. 1-17 and 1-18).

TABLE 1

| Sample No. | Glass type: amount | Filler CaO | Filler ZrO₂ | Sintering Temp. (°C.) | Sintering Time (hr.) | Crystalline phases other than glass phase (*1) | Dielectric constant | Strength (kg/mm²) |
|---|---|---|---|---|---|---|---|---|
| 1-1  | A:30 | 22        | 48   | 950  | 5   | Z(t), SP, G, AS,   | 14   | 20 |
| 1-2  | A:40 | 18.8      | 41.2 | 950  | 3   | Z(m), SP, G, AS,   | 13   | 20 |
| 1-3  | A:50 | 18.1      | 31.9 | 950  | 1   | Z(t,m), SP, G, AS, | 10.7 | 22 |
| 1-4  | A:50 | 16.7      | 33.3 | 900  | 1   | Z(t), SP, AS,      | 12   | 23 |
| 1-5  | A:50 | 15.6      | 34.4 | 900  | 1   | Z(t), SP, AS,      | 10.5 | 24 |
| 1-6  | A:50 | 2.2       | 47.8 | 900  | 1   | Z(t), SP, AS,      | 10.7 | 25 |
| 1-7  | A:55 | 16.3      | 28.7 | 900  | 1   | Z(t), SP, AS,      | 10.5 | 24 |
| 1-8  | A:55 | 14        | 31   | 900  | 1   | Z(t), SP, AS,      | 10.6 | 25 |
| 1-9  | A:55 | 14.1      | 30.9 | 850  | 1   | Z(t), SP, AS,      | 10.5 | 26 |
| 1-10 | A:55 | 2.0       | 43.0 | 850  | 1   | Z(t), SP, AS,      | 11   | 25 |
| 1-11 | A:55 | 1.6       | 43.4 | 900  | 1   | Z(t), SP, AS,      | 11   | 26 |
| 1-12 | A:60 | 12.5      | 27.5 | 800  | 1   | Z(t), SP, AS,      | 10   | 25 |
| 1-13 | A:60 | 1.4       | 38.6 | 800  | 1   | Z(t), SP, AS,      | 10.5 | 24 |
| 1-14 | A:70 | 9.4       | 20.6 | 800  | 0.5 | Z(t), SP, AS,      | 9.5  | 23 |
| *1-15 | A:60 | Al₂O₃    | 40   | 950  | 1   | A, SP, C, G        | 5.0  | 24 |
| *1-16 | A:60 | forsterite | 40  | 950  | 1   | F, SP, C, G        | 4.5  | 20 |
| *1-17 | B:60 | 12.5      | 27.5 | 980  | 2   | Z(m), SP, C, G     | 4.0  | 22 |
| *1-18 | C:60 | 12.5      | 27.5 | 1000 | 2   | Z(m), SP, C, G     | 5.0  | 24 |

(*1): Z(m) is a monoclinic crystal; Z(t,m) is a mixture of a tetragonal crystal ZrO₂ and a monoclinic crystal ZrO₂; SP is spinel; AS is anorthite; G is gahnite; C is cordierite; A is alumina and F is forsterite
*represents samples outside the range of the invention.

As is clear from the results of Table 1, the sintered body of the present invention in which $ZrO_2$, spinel and anorthite are precipitated has a dielectric constant of at least 8.5 and a strength of at least 20 Kg/mm².

Incidentally, when the amounts of $ZrO_2$ and CaO exceeded 70% by weight, the sintered body could not be elaborated if the sintering temperature is elevated to 1200° C.

In a comparative example, a sample No. 1-15 which used $Al_2O_3$ and a sample No. 1-16 which used forsterite as fillers gave a dielectric constant of 5.0 and 4.5. Furthermore, samples Nos. 1-17 and 1-18 using crystal glasses B and C did not precipitate anorthite or slawsonite, and could not be fully elaborated at a temperature of 800° to 950° C. Accordingly, sintered bodies having a high dielectric constant and a high strength could not be obtained.

(EXAMPLE 2)

A crystal glass A of the $SiO_2$—$Al_2O_3$—MgO—ZnO—$B_2O_3$ type (containing 44% by weight of $SiO_2$, 29% by weight of $Al_2O_3$, 11% by weight of MgO, 7% by weight of ZnO, and 9% by weight of $B_2O_3$), a crystal glass B (containing 40% by weight of $SiO_2$, 30% by weight of $Al_2O_3$, 10% by weight of MgO, 9% by weight of ZnO and 11% by weight of $B_2O_3$), $ZrO_2$ and $CaCO_3$ having an average particle diameter of 1 μm or less, and $SrTiO_3$ having an average particle diameter of 1 μm or less were mixed in accordance with the composition of Table 2. Incidentally, with regard to samples Nos. 2-1 to 2-16, a powder of $CaZrO_3$ having an average particle diameter of 0.7 μm was added.

An organic binder, a plasticizer and toluene were added to the mixture, and green sheets having a thickness of 300 μm were prepared. Five these green sheets were laminated and pressed and heat-pressed at a temperature of 50° C. under a pressure of 100 kg/cm². The laminated body was treated in a steam-containing nitrogen atmosphere to remove the binder from the laminated body at 700° C., and thereafter, sintered in dry nitrogen under the conditions shown in Table 2 to give a glass-ceramic sintered body.

The dielectric constants and the fracture strengths of the sintered bodies were evaluated by the methods shown in Example 1. The results of measurements are shown in Table 2.

As comparative examples, sintered bodies were prepared and evaluated by using $Al_2O_3$ and forsterite instead of $ZrO_2$ and CaO as fillers (samples Nos. 2-22 and 2-26).

Furthermore, instead of the above glasses, a glass C having a composition containing 55.2% by weight of $SiO_2$, 12% by weight of $Al_2O_3$, 4.4% by weight of $B_2O_3$, 20% by weight of $ZrO_2$, 6.7% by weight of ZnO, 1.6% by weight of $Na_2O$ and 0.1% by weight of $ZrO_2$, a glass D having a composition containing 60.7% by weight of $SiO_2$, 9.3% by weight of $Al_2O_3$, 5% by weight of $B_2O_3$, 15.4% by weight of BaO, 8.6% by weight of ZnO and 1% by weight of $K_2O$, and $CaZrO_3$ having an average particle diameter of 0.7 μm as a filler, and sintered bodies were evaluated in the same way as above (samples Nos. 2-24 and 2-25).

Figure 4:
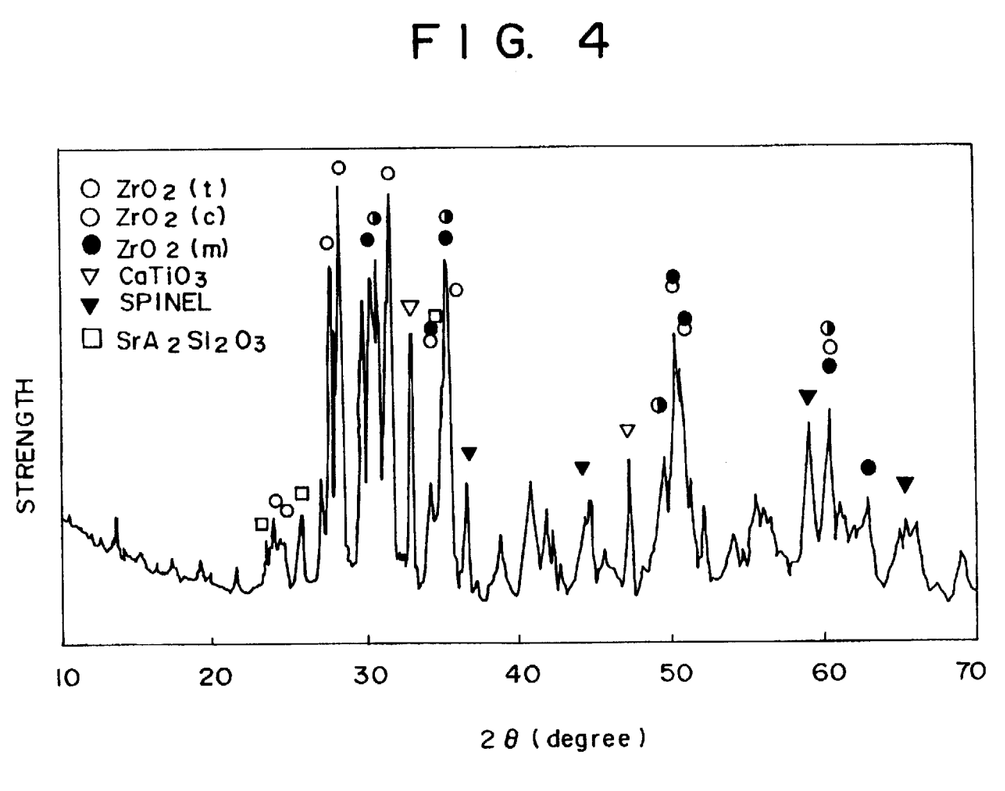
FIG. 4 is an X-ray diffraction measurement chart of the sintered body (the sintered body of FIG. 2) of the present invention.

In Table 2, the X-ray diffraction measuring chart of the sintered body of a sample No. 2-6 is shown in FIG. 4.

and a strength of at least 25 kg/mm² and also showed an excellent property of TCC in the range of −200 to +200.

Incidentally, when the amounts of $ZrO_2$ and CaO exceeded 69% by weight, it is impossible to elaborate the ceramic if the sintering temperature is elevated to 1400° C. A sample No. 2-28 to which $SrTiO_3$ was not added had a large TCC.

On the other hand, a sample No. 2-22 using $Al_2O_3$ as a filler and a sample No. 2-23 containing forestrite as a filler in comparative examples showed a dielectric constant of 6.0 and 5.0. Samples Nos. 2-24 and 2-25 using glasses C and D did not precipitate a spinel crystalline phase, and could not give sintered bodies having high strength.

(EXAMPLE 3)

As crystal glasses of the $SiO_2$—$Al_2O_3$—MgO—ZnO—$B_2O_3$ type, a crystal glass A comprising 44% by weight of $SiO_2$, 29% by weight of $Al_2O_3$, 11% by weight of MgO, 7% by weight of ZnO and 9% by weight of $B_2O_3$ and a crystal glass B of 45% by weight of $SiO_2$, 25% by weight of $Al_2O_3$, 10% by weight of MgO, 9% by weight of ZnO and 11% by weight of $B_2O_3$, $ZrO_2$ and $CaCO_3$ having an average particle diameter of 1 μm or below, $SrTiO_3$ having an average particle diameter of 1 μm or below, and a compound of $Al_2O_3$, a compound of Al and a compound of Si having an average particle diameter of 0.3, 1 or 2 μm are mixed in

TABLE 2

| Sample No. | Glass type amount | Fillers CaO | $ZrO_2$ | $SrTiO_3$ | Sintering conditions Temp. | Time | TCC (ppm/°C.) | Dielectric constant | Strength (kg/mm²) | Crystalline phase (*) |
|---|---|---|---|---|---|---|---|---|---|---|
| 2-1 | A 35.0 | 7.82 | 17.18 | 40.00 | 1000 | 1 | −190 | 15.0 | 26 | Z, CT, SP, AS, SA |
| 2-2 | A 47.5 | 13.14 | 28.86 | 10.50 | 950 | 1 | 120 | 10.0 | 25 | Z, CT, SP, AS, SA |
| 2-3 | A 47.0 | 13.26 | 29.14 | 10.60 | 950 | 1 | 100 | 10.5 | 27 | Z, CT, SP, AS, SA |
| 2-4 | A 46.5 | 13.39 | 29.41 | 10.70 | 950 | 1 | 60 | 10.5 | 25 | Z, CT, SP, AS, SA |
| 2-5 | A 46.0 | 13.51 | 29.69 | 10.80 | 950 | 1 | 30 | 11.0 | 26 | Z, CT, SP, AS, SA |
| 2-6 | A 45.5 | 13.64 | 29.69 | 10.90 | 1000 | 1 | 5 | 11.5 | 25 | Z, CT, SP, AS, SA |
| 2-7 | A 45.0 | 13.76 | 30.24 | 11.00 | 1000 | 1 | 0 | 11.5 | 28 | Z, CT, SP, AS, SA |
| 2-8 | A 44.5 | 13.89 | 30.51 | 11.10 | 1000 | 1 | 0 | 11.7 | 27 | Z, CT, SP, AS, SA |
| 2-9 | A 45.5 | 13.30 | 29.21 | 11.99 | 1000 | 1 | 0 | 11.0 | 25 | Z, CT, SP, AS, SA |
| 2-10 | A 45.5 | 12.96 | 28.46 | 13.08 | 1000 | 1 | 0 | 11.1 | 26 | Z, CT, SP, AS, SA |
| 2-11 | B 45.5 | 12.61 | 27.72 | 14.17 | 1000 | 1 | 0 | 10.5 | 27 | Z, CT, SP, AS, SA |
| 2-12 | B 45.5 | 12.27 | 26.97 | 15.26 | 1000 | 1 | 0 | 11.5 | 25 | Z, CT, SP, AS, SA |
| 2-13 | B 46.0 | 11.82 | 25.98 | 16.20 | 950 | 1 | 30 | 11.0 | 26 | Z, CT, SP, AS, SA |
| 2-14 | B 45.5 | 11.93 | 26.22 | 16.35 | 1000 | 1 | 0 | 11.5 | 27 | Z, CT, SP, AS, SA |
| 2-15 | B 45.0 | 12.04 | 26.46 | 16.50 | 970 | 1 | −10 | 12.0 | 26 | Z, CT, SP, AS, SA |
| 2-16 | B 44.5 | 12.15 | 26.70 | 16.65 | 1000 | 1 | −50 | 12.8 | 25 | Z, CT, SP, AS, SA |
| 2-17 | B 45.7 | 10.19 | 22.39 | 21.72 | 950 | 1 | 0 | 11.8 | 26 | Z, CT, SP, AS, SA |
| 2-18 | A 46.0 | 1.00 | 42.50 | 10.50 | 960 | 1 | 50 | 10.0 | 27 | Z, CT, SP, AS, SA |
| 2-19 | A 46.0 | 20.00 | 32.00 | 2.0 | 950 | 1 | 190 | 9.5 | 26 | Z, CT, SP, AS, SA |
| 2-20 | A 45.0 | 6.88 | 15.12 | 33.0 | 970 | 1 | −50 | 13.5 | 26 | Z, CT, SP, AS, SA |
| 2-21 | A 65.0 | 1.00 | 31.00 | 3.0 | 1000 | 1 | 180 | 9.5 | 27 | Z, CT, SP, AS, SA |
| *2-22 | A 50.0 | $Al_2O_3$ | 45.00 | 5.00 | 970 | 1 | 100 | 6.0 | 24 | Al, SP, Ti, AS |
| *2-23 | A 50.0 | forsterite | 45.00 | 5.00 | 970 | 1 | 120 | 5.0 | 23 | Al, SP, Ti, AS, PS |
| *2-24 | C 50.0 | 11.00 | 24.00 | 15.00 | 950 | 1 | −5 | 12.0 | 15 | Z, CT, AS, SA |
| *2-25 | D 55.0 | 9.90 | 21.60 | 13.50 | 970 | 1 | 0 | 10.0 | 17 | Z, CT, AS, SA |
| Δ2-26 | A 50.0 | 15.00 | 30.00 | MT5.0 | 950 | 1 | 200 | 9.0 | 24 | Ti,Z,C,SP,G,AS |
| Δ2-27 | A 50.0 | 15.00 | 30.00 | CT5.0 | 950 | 1 | 230 | 9.5 | 23 | Ti,Z,C,SP,G,AS |
| Δ2-28 | A 50.0 | 15.64 | 34.36 | not added | 950 | 1 | 250 | 9.1 | 25 | Z, AS, SP |

(*1) crystalline phases Z:$ZrO_2$ Al:$Al_2O_3$ SP:spinel SA:slavsonite CT:$CaTiO_2$ Ti:$TiO_2$ G:gahnite MT:$MgTiO_3$ C:cordierite PS:forsterite AS:anorthite
*:Outside the defined range
Δ: Referential samples As is shown from the results of Table 2, samples in which as crystalline phases other than the glass phase, the $ZrO_2$, the perovskite-type crystalline phase, the spinel-type phase, the anorthite crystalline phase, and/or the slawasonite-type crystalline phase all showed a dielectric constant of at least 9.0 accordance with the compositions shown in Tables 3 and 4. In Tables 3 and 4, with respect to samples Nos. 3-1 and 3-12, a $CaZrO_3$ powder having an average particle diameter of 0.7 μm was added.

An organic binder, a plasticizer and toluene were added to the mixture, and green sheets having a thickness of 300 μm were prepared by a doctor blade method. Five green sheets were laminated and heat-pressed at a temperature of 50° C. under a pressure of 100 Kg/cm². The laminated body was treated in a steam-containing nitrogen atmosphere to remove the binder at 700° C., and thereafter sintered in dry nitrogen under the conditions shown in Tables 3 and 4 to obtain a subtrate plate.

The dielectric constants and the fracture strengths of the sintered bodies were measured by the methods shown in Example 1.

An Ag electrode was coated on both surfaces of the above sample and the electrostatic capacity was measured and calculated at each temperature at in a constant-temperature tank by using an LCR meter at 1 MHz within a range of −50° C. to +125° C. in a constant-temperature tank.

Furthermore, a sample having a length of 70 mm, a thickness of 3 mm and a width of 4 mm was cut out from the sintered body, and its fracture strength by a three point bending test in accordance with JIS-C-2141 was measured.

The acid resistance was evaluated by dipping a sample of the above-mentioned shape in 50 ml of a 6N—HCl solution for 15 minutes, and a weight decrease (%) was evaluated before and after the test by the following weight decrease.

○: 0.05% or below

Δ: 0.05–0.1%

X: more than 0.1%

As comparative examples, sintered bodies were prepared by using $Al_2O_3$ and forsterite in place of $ZrO_2$ or CaO as filler components (samples Nos. 3-23 and 3-24). Furthermore, sintered bodies were prepared in the same way as above using a crystal glass C comprising 55.2% by weight of $SiO_2$, 12% by weight of $Al_2O_3$, 4.4% by weight of $B_2O_3$, 26% by weight of SrO, 1.6% by weight of $Na_2O$ and 0.1% by weight of $ZrO_2$ and a crystal glass D comprising 60.7% by weight of SiO, 17.9% by weight of $Al_2O_3$, 5% by weight of $B_2O_3$, 15.4% by weight BaO and 1% by weight of $K_2O$.

TABLE 3

| Sample No. | Glass type/ amount | Composition (wt. %) Fillers | | | | | Sintering conditions | | Dielectric cons- tant | Dielectric loss ($\times 10^{-4}$) | Strength (kg/mm²) | TCC (ppm/ °C.) | Oxi- dation resist- ance | Crystalline phases (*1) |
|---|---|---|---|---|---|---|---|---|---|---|---|---|---|---|
| | | CaO | $ZrO_2$ | $SrTiO_3$ | $Al_2O_3$ | $SiO_2$ | Temp. (°C.) | Time (hr) | | | | | | |
| *3-1 | A 62.31 | 6.58 | 14.45 | 16.66 | — | — | 950 | 1 | 11.0 | 15 | 24 | +40 | X | (AS,SA),Z,(G,SP),Ti |
| 3-2 | A 61.7 | 6.51 | 14.3 | 16.5 | 0.99 | — | 900 | 1 | 10.5 | 14 | 30 | +35 | ○ | (AS,SA),Z,(G,SP),Ti, A,BA |
| 3-3 | A 60.14 | 6.35 | 13.95 | 16.08 | 3.48 | — | 900 | 1 | 9.6 | 15 | 35 | +30 | ○ | (AS,SA),Z,(G,SP),Ti, A,BA |
| 3-4 | A 58.12 | 6.14 | 13.48 | 15.54 | 6.72 | — | 875 | 1 | 9.7 | 18 | 35 | +35 | ○ | (AS,SA),Z,(G,SP),Ti, A,BA |
| 3-5 | A 51.93 | 5.48 | 12.04 | 13.88 | 16.67 | — | 1000 | 1 | 8.5 | 13 | 29 | +50 | ○ | (AS,SA),Z,(G,SP),Ti, A,BA |
| *3-6 | A 53.0 | 2.0 | 3.0 | 40.0 | 2.0 | — | 1000 | 2 | 12.0 | 20 | 20 | −300 | X | (AS,SA),Z,(G,SP),Ti, A |
| 3-7 | A 55.1 | 4.4 | 9.67 | 21.84 | 8.99 | — | 950 | 1 | 8.9 | 8.0 | 31 | +10 | ○ | (AS,SA),Z,(G,SP),Ti, A,BA |
| 3-8 | A 57.77 | 5.38 | 11.82 | 15.88 | 9.15 | — | 925 | 1 | 8.5 | 12 | 33 | +20 | ○ | (AS,SA),Z,(G,SP),Ti, A,BA |
| 3-9 | A 57.68 | 4.91 | 10.82 | 17.45 | 9.14 | — | 950 | 1 | 8.7 | 13 | 32 | +15 | ○ | (AS,SA),Z,(G,SP),Ti, A,BA |
| 3-10 | A 58.1 | 4.51 | 9.9 | 15.98 | 11.51 | — | 975 | 1 | 8.6 | 13 | 33 | +20 | ○ | (AS,SA),Z,(G,SP),Ti, A,BA |
| 3-11 | A 59.63 | 5.72 | 12.55 | 16.87 | 3.75 | 1.48 | 925 | 1 | 9.0 | 13 | 35 | +10 | ○ | (AS,SA),Z,(G,SP),Ti, A,BA |
| *3-12 | A 85.0 | 3.0 | 6.0 | 5.0 | 1.0 | — | 850 | 1 | 6.2 | 90 | 14 | +300 | X | (G,SP),A,2S,Ti |

*:indicates samples outside the range of the present invention.

TABLE 4

| Sample No. | Glass type/ amount | Composition (wt. %) Fillers | | | | | Sintering conditions | | Dielectric cons- tant | Dielectric loss ($\times 10^{-4}$) | Strength (kg/mm²) | TCC (ppm/ °C.) | Oxi- dation resist- ance | Crystalline phases (*1) |
|---|---|---|---|---|---|---|---|---|---|---|---|---|---|---|
| | | CaO | $ZrO_2$ | $SrTiO_3$ | $Al_2O_3$ | $SiO_2$ | Temp. (°C.) | Time (hr) | | | | | | |
| 3-13 | A 60.9 | 5.84 | 12.83 | 17.23 | 2.3 | 0.9 | 900 | 1 | 9.2 | 15 | 32 | +15 | ○ | (AS,SA),Z,(G, SP),Ti,A,BA |
| 3-14 | A 62.22 | 5.97 | 13.1 | 17.61 | 0.79 | 0.31 | 875 | 1 | 10.5 | 16 | 30 | +10 | ○ | (AS,SA),Z,(G, SP),Ti,A,BA |
| 3-15 | A 60.66 | 5.81 | 12.78 | 17.17 | 1.24 | 2.34 | 875 | 1 | 9.8 | 14 | 32 | +15 | ○ | (AS,SA),Z,(G, SP),Ti,A,BA |
| 3-16 | B 61.62 | 5.91 | 12.98 | 17.44 | 1.25 | 0.8 | 900 | 1 | 9.7 | 15 | 31 | +17 | ○ | (AS,SA),Z,(G, SP),Ti,A,BA |
| 3-17 | B 61.05 | 5.85 | 12.86 | 17.27 | 0.62 | 2.35 | 900 | 1 | 9.9 | 13 | 33 | +15 | ○ | (AS,SA),Z,(G, |

TABLE 4-continued

| | | Composition (wt. %) | | | | | Sintering conditions | | Dielectric constant | Dielectric loss ($\times 10^{-4}$) | Strength (kg/mm$^2$) | TCC (ppm/°C.) | Oxidation resistance | Crystalline phases (*1) |
|---|---|---|---|---|---|---|---|---|---|---|---|---|---|---|
| Sample No. | Glass type/ amount | CaO | ZrO$_2$ | Fillers SrTiO$_3$ | Al$_2$O$_3$ | SiO$_2$ | Temp. (°C.) | Time (hr) | | | | | | |
| 3-18 | B 62.02 | 5.94 | 13.06 | 17.55 | 0.63 | 0.8 | 850 | 1 | 10.0 | 14 | 31 | +20 | ○ | SP),Ti,A,BA (AS,SA),Z,(G, SP),Ti,A,BA |
| 3-19* | A 60.0 | 5.0 | 5.0 | 9.0 | 5.0 | 16.0 | 1400 | 3 | 7.0 | 19 | 20 | +30 | Δ | (AS,SA),ZS,(G, SP),Ti,A,BA |
| 3-20* | C 60.0 | 6.5 | 14.0 | 16.0 | 3.5 | — | 975 | 1 | 5.0 | 40 | 10 | — | X | CZ,(G,SP),ST,A |
| 3-21* | C 58.0 | 6.0 | 13.0 | 16.0 | 7.0 | — | 950 | 1 | 4.0 | 60 | 10 | — | X | CZ,(G,SP),ST,A |
| 3-22* | C 62.5 | 6.0 | 13.0 | 17.0 | 1.0 | 0.5 | 975 | 1 | 6.0 | 70 | 11 | — | X | CZ,(G,SP),ST,A |
| 3-23* | A 60.0 | Al$_2$O$_3$ | 25 | 15.0 | — | — | 1000 | 3 | 5.6 | 25 | 22 | 80 | ○ | A,PS,Ti,AS |
| 3-24* | A 60.0 | forsterite | 25 | 15.0 | — | — | 1000 | 1 | 5.3 | 30 | 23 | 70 | ○ | A,PS,Ti,AS,FS |
| 3-25* | D 55.0 | 5.0 | 10.0 | 10.0 | 10.0 | 10.0 | 1000 | 1 | 5.0 | 90 | 10 | — | X | CZ,(G,SP),ST,A |

*:indicates samples outside the range of the present invention
(*1): A:Al$_2$O$_3$ PS:forsterite Ti:TiO$_2$ AS:anorthite G:gahnite ZS:ZrSiO$_2$ BA:BAlO$_2$ SA:slausonite Z:ZrO$_2$ CT:CaTiO$_3$ SP:spinel ST:SrTiO$_3$ CZ:CaZrO$_3$ As is clear from the results shown in Tables 3 and 4, the sintered bodies of the present invention in which as crystalline phases, the (Ca, Sr)—Al—Si—O type composite oxide crystalline phase, the ZrO$_2$ crystalline phase, TiO$_2$ (rutile-type) crystalline phase, the spinel-type crystalline phase and the Al$_2$O$_3$ crystalline phase were precipitated showed a dielectric constant of at least 8.5 and a strength of at least 25 Kg/mm$^2$. Those which were sintered at 850° to 975° C. had a dielectric constant of at least 9 and a strength of at least 30 Kg/mm$^2$.

In the ceramic body of this invention, anorthite (AS: CaAl$_2$Si$_2$O$_8$) and slawsonite (SA: SrAl$_2$Si$_2$O$_8$) were composite oxides of alkaline earth elements, aluminum and silicon), but it was difficult to differentiate them by X-ray diffraction measurement. Furthermore, gahnite (G: ZnAl$_2$O$_4$) and spinel (SP: MgAl$_2$O$_4$) are spinel-type crystals, but gahnite existed in a larger amount than spinel. The presence of the glass phase in a very minute quantity was noted.

Furthermore, a sample No. 3-23 using Al$_2$O$_3$ as a filler and a sample No. 3-24 using forsterite as a filler in accordance with comparative examples had a dielectric constant of 5.6 and 5.3. Samples Nos. 3-20 to 3-22 and 3-25 having different crystal glasses C and D could not be fully elaborated at 800° to 1000° C. and sintered bodies having a high dielectric constant and a high strength could not be obtained.

We claim:

1. A glass-ceramic sintered body containing Si, Al, Zn, at least one element of Group 2a, at least one element of Group 4a of the periodic table and Boron and Oxygen, as constituent elements, and having a dielectric constant of not smaller than 8.5 and a fracture strength of not smaller than 20 kg/cm$^2$, wherein said sintered body comprises a glass phase and crystalline phases comprising a first crystalline phase of a composite oxide containing Si, Al and Sr, or Si, Al, Ca and Sr, the first crystalline phase comprising a slawsonite crystalline phase, a second crystalline phase of ZrO$_2$ crystalline and a third crystalline phase of spinel crystalline.

2. The glass-ceramic sintered body according to claim 1, wherein the sintered body is obtainable by preparing a mixture comprising 30 to 70% by weight of a glass comprising at least SiO$_2$, Al$_2$O$_3$, MgO, ZnO and B$_2$O$_3$ and 70 to 30% by weight of Ca oxide and Zr oxide powders or a CaZrO$_3$ powder as a filler, and firing the mixture at a temperature of 800° to 950° C.

3. The glass-ceramic sintered body according to claim 1, wherein the crystalline phases further comprises a fourth crystalline phase comprising at least one member selected from the group consisting of TiO$_2$ crystalline, Al$_2$O$_3$ crystalline, perovskite crystalline and composite oxide crystalline containing Al and B.

4. The glass-ceramic sintered body according to claim 1, wherein the sintered body is used for an insulation substrate of a circuit board, and has a layer of wiring comprising a metal selected from copper, silver and gold on the surface thereof.

* * * * *